(12) United States Patent
Osborne

(10) Patent No.: US 9,087,603 B2
(45) Date of Patent: *Jul. 21, 2015

(54) METHOD AND APPARATUS FOR SELECTIVE DRAM PRECHARGE

(75) Inventor: Randy B. Osborne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1628 days.

This patent is subject to a terminal disclaimer.

(21) Appl. No.: 12/369,105

(22) Filed: Feb. 11, 2009

(65) Prior Publication Data

US 2010/0202229 A1 Aug. 12, 2010
US 2012/0294101 A9 Nov. 22, 2012

(51) Int. Cl.
*G11C 8/00* (2006.01)
*G11C 11/4094* (2006.01)
*G11C 7/10* (2006.01)
*G11C 8/18* (2006.01)

(52) U.S. Cl.
CPC .......... *G11C 11/4094* (2013.01); *G11C 7/1012* (2013.01); *G11C 8/18* (2013.01)

(58) Field of Classification Search
USPC .......... 365/233.13, 149, 230.03, 203, 185.11, 365/230.05, 230.06
See application file for complete search history.

(56) References Cited

U.S. PATENT DOCUMENTS

| 5,323,341 | A | | 6/1994 | McCormack et al. |
| 5,463,590 | A | * | 10/1995 | Watanabe ................ 365/230.03 |
| 5,539,696 | A | | 7/1996 | Patel |
| 5,544,306 | A | | 8/1996 | Derring et al. |
| 5,974,501 | A | | 10/1999 | Shaver et al. |
| 6,147,926 | A | | 11/2000 | Park |
| 6,154,825 | A | | 11/2000 | Murdoch et al. |
| 6,182,192 | B1 | | 1/2001 | Rovati |
| 6,470,433 | B1 | | 10/2002 | Prouty et al. |
| 6,496,440 | B2 | * | 12/2002 | Manning .................. 365/230.03 |
| 6,615,326 | B1 | | 9/2003 | Lin |
| 6,629,194 | B2 | * | 9/2003 | Kumar et al. ................. 711/104 |
| 6,804,760 | B2 | | 10/2004 | Wiliams |
| 6,948,081 | B2 | | 9/2005 | Lee |
| 2005/0002253 | A1 | * | 1/2005 | Shi et al. ........................ 365/222 |

OTHER PUBLICATIONS

NEC Preliminary User's Manual Memory Controller NA85E535 NBA85E35Vxx, Aug. 2002, Oct. 2002, second edition, 16-27, 58-68, 80-90, 102-103, 119-132, 174-182.

* cited by examiner

*Primary Examiner* — Han Yang
(74) *Attorney, Agent, or Firm* — Blakely, Sokoloff, Taylor & Zafman LLP

(57) ABSTRACT

Apparatus and method for using a precharge command in which a plurality of address lines are individually used to specify which banks of memory cells within a memory device have an open row that is to be closed.

5 Claims, 8 Drawing Sheets

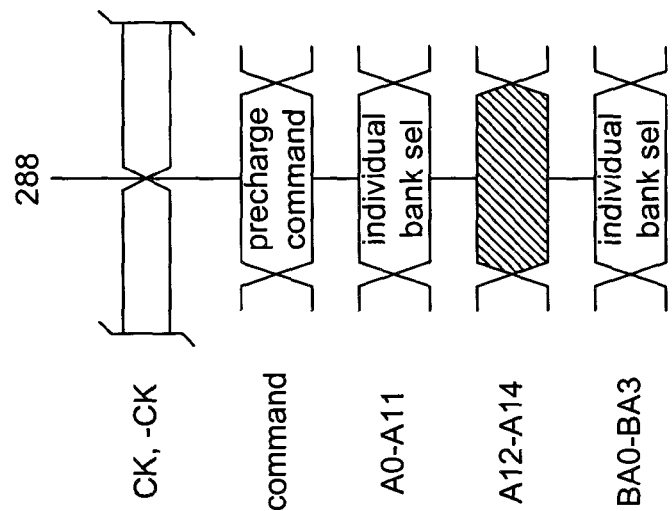

METHOD AND APPARATUS FOR SELECTIVE DRAM PRECHARGE

RELATED APPLICATION

This application is a Continuation Application of U.S. application Ser. No. 10/676,666, entitled "Method and Apparatus for Selective DRAM Precharge", filed on Sep. 30, 2003, now issued as U.S. Pat. No. 7,519,762 and priority is claimed thereof.

BACKGROUND

Dynamic random access memory (DRAM) devices provide the benefits of higher storage densities and less power consumption in comparison to other memory technologies, including and most notably, static random access memory (SRAM) devices. However, these benefits come at the cost of incurring various required delays before and/or after each access for reading, writing and other functions to allow the memory cells and other components within DRAM devices to be prepared for a subsequent access. Examples of such delays are row precharges, refresh operations, row activation, etc. Attempts at efficiently managing these myriad delays has resulted in the creation of commands to allow the times at which these various delays are incurred to be more precisely controlled, but this creates the additional overhead of additional commands needing to be transmitted between reading and writing accesses.

It has also become common practice to attempt to reduce both costs and the physical size of DRAM devices by multiplexing multiple functions onto the various signal input and outputs. However, this multiplexing requires multiple phases to transmit commands and/or addresses, effectively replacing physical separation of signals with temporal separation in which more time is required to allow various signal inputs and outputs to first serve one function and then serve at least a second, if not more functions. One example of multiplexing that brings about such a cost in time arises from the separation of addresses transmitted to DRAM devices into at least two parts (usually at least a row and a column address) that are then multiplexed onto the same input signals such that a first part of the address must be sent during one distinct time period, followed by at least a second part of the address being sent during at least one more distinct time period. This temporal separation into distinct phases increases, yet again, the overhead for the myriad commands required.

As DRAM devices have become progressively faster as a result of advances in the design of both the DRAM cells making up a DRAM device and in the transistors, etc., used to make up the DRAM cells, the speed at which the interfaces made up of the multiplexed input and output signals of DRAM devices operate have needed to increase. In an effort to achieve higher interface speeds while maintaining integrity in the transmission of commands, addresses and data, it has become common practice to synchronize the various phases and functions performed by multiplexed inputs and outputs to a clock signal to ensure that the states of the various inputs and outputs are transmitted and latched at appropriate times. Initially, whole clock cycles were commonly used as the timing basis for events on a memory bus. However, even speedier DRAM devices have resulted in the more recent adoption of half clock cycles as the timing basis for events on a memory bus, resulting in what has been referred to as "double-clocking" of signals, or what is more commonly referred to in reference to common SDRAM (synchronous DRAM) devices as "DDR" or "double data rate" devices. Although the increased speeds of interfaces would seem to provide an opportunity to fully accommodate the overhead of the many required commands, difficulties have been encountered at such higher interface speeds in meeting the more stringent signal setup and hold timing requirements in the transmission of each of the various phases required in the transmission of each of the myriad commands and/or addresses. These difficulties have been such that it has been proposed that commands and/or addresses be transmitted at only up to half the clock rate at which data is transferred in what has been called "2n clocking," thus denying the benefits of double-clocking to the transmission of commands and/or addresses.

The desire to maintain low cost by limiting the number of pins along with a desire to not have more phases per command than necessary to convey the command and accompanying address information has encouraged the acceptance of having commands with a format in which only a very limited portion of a DRAM device may be specified as being involved in a particular command or the whole DRAM device may be specified as being involved in a particular command. In effect, a situation bordering on almost an "all or nothing" in specifying what portion of a DRAM device is involved in a given command is all that is permitted by currently accepted command formats. The end result is the frequent need to transmit multiple commands to cover a portion of a DRAM device that is less all of the DRAM device, but more than the very limited portion than can be specified in the format of a single command.

The cumulative time penalties resulting from these various difficulties in transmitting commands and/or addresses have started to become significant to extent rivaling the time lost to preparing the DRAM cells for being accessed. Indeed, there is growing concern that the overhead required for transferring addresses and/or commands may take up more of the available bandwidth of a memory bus than is required for the actual transferring of data.

BRIEF DESCRIPTION OF THE DRAWINGS

The objects, features, and advantages of the present invention will be apparent to one skilled in the art in view of the following detailed description in which:

FIGS. 2a, 2b and 2c are timing diagrams of embodiments employing a memory bus.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Embodiments of the present invention concern incorporating support for carrying out a precharge operation on one or more open rows in one or more banks of memory cells within a memory device in a manner that reduces the number of commands required and hence reduces the bandwidth required for transmitting commands to initiate such precharge operations. Although the following discussion centers on DRAM devices in which memory cells are organized into multiple two dimensional arrays of rows and columns, it will be understood by those skilled in the art that the invention as hereinafter claimed may be practiced in support of any type of memory device having memory cells organized in any of a number of ways, including interleaved banks, arrays of more than two dimensions (i.e., more than two-part addresses), content-addressable, etc. Also, although at least part of the following discussion centers on memory devices within computer systems, it will be understood by those skilled in the art that the invention as hereinafter claimed may be practiced in connection with other electronic devices having memory devices.

Figure 1:
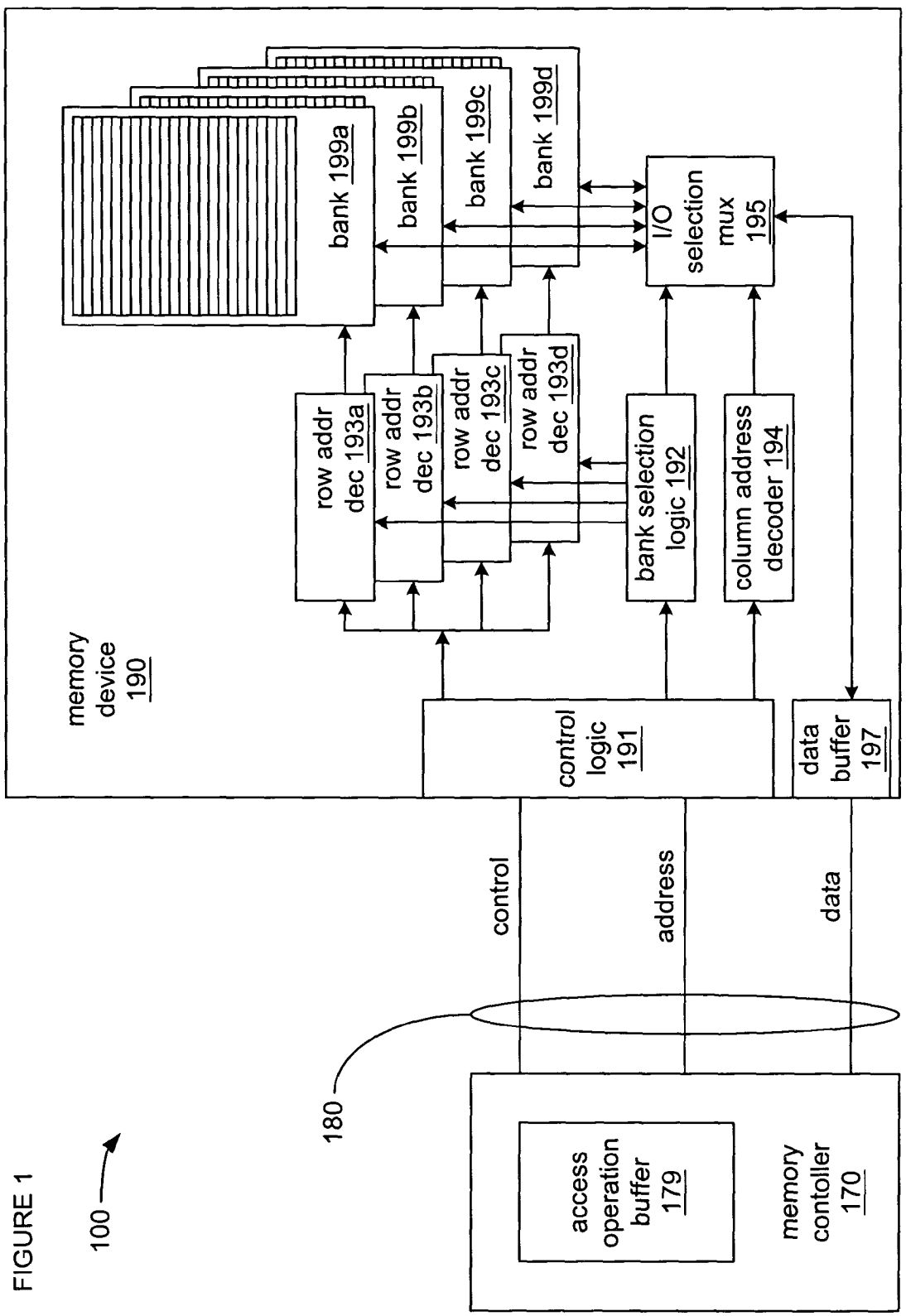
FIG. 1 is a block diagram of an embodiment employing a memory system.

FIG. 1 is a simplified block diagram of one embodiment employing a memory system. Memory system 100 is, at least in part, made up of memory controller 170 and memory device 190 coupled together via memory bus 180. Those skilled in the art of the design of memory systems will readily recognize that FIG. 1 depicts one form of a relatively simple memory system, and that alternate embodiments are possible in which the exact arrangement and configuration of components may be reduced, augmented or otherwise altered without departing from the spirit and scope of the present invention as hereinafter claimed. For example, although memory system 100 is depicted as having only one memory bus 180 and only one memory device 190 for the sake of simplicity in the discussion that follows, it will be readily understood by those skilled in the art that other possible embodiments of memory system 100 may be made up of multiple memory buses and/or devices.

Memory controller 170 controls the functions carried out by memory device 190 as part of providing access to memory device 190 to external devices (not shown) coupled to memory controller 170. Specifically, an external device coupled to memory controller 170 issues commands to memory controller 170 to store data within memory device 190, and to retrieve stored data from memory device 190. Memory controller 170 receives these commands and relays them to memory device 190 in a format having timing and protocols compatible with memory bus 180 and/or the combination of control logic 191 and data buffer 197 that make up the interface between memory device 190 and memory bus 180. In effect, memory controller 170 coordinates accesses made to memory cells within memory device 190 in answer to read and write commands from external devices. In support of these functions in various embodiments, memory controller 170 also coordinates various maintenance operations that must be performed to ensure that data stored within memory device 190 is preserved, including the initiation of regular refresh operations and the occurrence of precharge operations as needed between accesses.

In some embodiments, memory controller 170 incorporates access operation buffer 179 in which commands from one or more external devices to carry out read and write operations involving memory device 190 may be stored. In some variations of such embodiments, memory controller 170 parses read and write commands queued in access operation buffer 179 to combine and/or reorder read and/or write commands. In other variations of such embodiments, memory controller 170 parses read and write commands to determine which rows within banks 199a-199d should be activated or precharged in anticipation of upcoming read and/or write operations to be carried out. In still other variations of such embodiments, one or more prediction algorithms may be used, either in cooperation with parsing of commands within access operation buffer 179 or not, to speculatively predict which rows within banks 199a-199d should be activated or precharged in anticipation of upcoming read and/or write operations to be carried out.

Memory bus 180 is made up of various control, address and data signal lines coupling together memory controller 170 and memory device 190. The exact quantity and characteristics of the various signal lines making up various possible embodiments of memory bus 180 may be configured to be interoperable with any of a number of possible memory interfaces, including those meant to be compatible with known types of memory devices, among them being DRAM (dynamic random access memory) devices such as FPM (fast page mode) memory devices, EDO (extended data out), dual-port VRAM (video random access memory), window RAM, SDR (single data rate), DDR (double data rate), RAMBUS™ DRAM, etc. In some embodiments, where activity on various signal lines is meant to be coordinated with a clock signal, one or more of the signal lines, perhaps the control signal lines, serves to transmit a clock signal between memory controller 170 and memory device 190. In some embodiments, one or more control signals and address signals may be multiplexed onto common signal lines such that control signals and address signals are transmitted at different times on common conductors for carrying signals between memory controller 170 and memory device 190. Also, in some embodiments, one or more address signals and data signals may be multiplexed onto common signal lines.

Memory device 190 is a DRAM memory device with an interface made up of control logic 191 and data buffer 197 configured to be interoperable with memory bus 180. In some embodiments, memory device 190 is a single integrated circuit. In other embodiments, memory device 190 is made up of multiple integrated circuits of a removable memory module, such as a SIMM (single inline memory module), SIPP (single inline pin package), DIMM (dual inline memory module), etc.

The memory cells of memory device 190 are grouped into multiple banks, such as banks 199a-199d, with each bank being organized into a two dimensional array of memory cells having rows and columns. In some embodiments, control logic 191 receives at least some commands and addresses from memory controller 170 through memory bus 180, and carries out those commands using row address decoders 193a-193d, column address decoder 194 and/or bank selection logic 192 to access one or more specific portions of one or more of banks 199a-199d. In response to at least read and write commands received from memory controller 170, I/O selection multiplexer 195 and data buffer 197 are used to store data into or retrieve data from one or more memory cells.

Figure 2C:
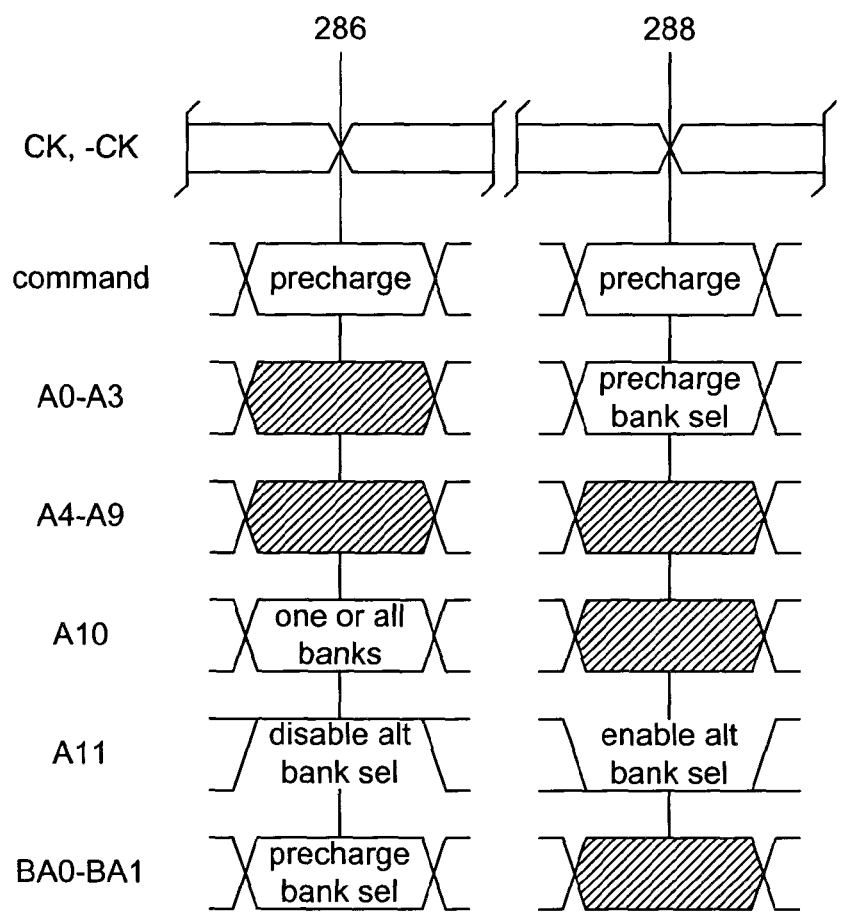

FIGS. 2a, 2b and 2c are timing diagrams of embodiments employing the transmission of signals across a memory bus. All of FIGS. 2a-c depict the transmission of a precharge command to one or more memory devices. Although these figures and the accompanying discussion center on embodiments of memory buses on which transactions take place that are synchronized to a clock signal, it will be readily understood by those skilled in the art that other embodiments may employ other forms of timing coordination or may be asynchronous. Also, although various embodiments are depicted with various specific quantities of banks, address signals and/ or bank address signals, those skilled in the art will readily understand that these embodiments are given these specific quantities as part of an effort to provide understandable examples for the sake of clarity of illustration, and should not be construed as limiting the spirit or scope of the present invention as hereinafter claimed. As a specific example, although FIG. 2b depicts the use of up to 16 signal lines to support individually selecting up to 16 banks, other embodiments with only up to 8 banks, and therefore, needing only up to 8 signal lines to support individual selection of banks are possible. It is to be expected that differing quantities will likely be generated over time in implementations of the present invention that may someday arise.

FIG. 2a depicts an embodiment configured to have signals and timings compatible with known synchronous DRAM interfaces in support of an example memory device having four banks of memory. Coincident with the transmission of the actual precharge command during time point 288, each one of address signals A0-A3 is used to individually select a corresponding one of four banks of memory affected by the precharge command. In other words, the transmission of a high or low state via each of signals A0, A1, A2 and A3 coincident with the transmission of the precharge command may dictate whether or not each of banks 0, 1, 2 and 3, respectively, are affected by the current transmission of a precharge command.

FIG. 2b depicts another embodiment similar to that depicted in FIG. 2a, except for illustrating support for possibly as many as 16 banks of memory. Coincident with the transmission of the actual precharge command during time point 288, each one of address signals A0-A11 and BA0-BA3 is used to separately select a corresponding one of up to 16 banks of memory affected by the precharge command. In other words, the transmission of a high or low state via each of signals A0, A1, A2, A3, A4, A5, A6, A7, A8, A9, A10, A11, BA0, BA1, BA2 and BA3 coincident with the transmission of the precharge command may dictate whether or not each of banks 0, 1, 2, 3, 4, 5, 6, 7, 8, 9, 10, 11, 12, 13, 14, 15 and 16, respectively, are affected by the current transmission of the precharge command.

FIG. 2c depicts another embodiment similar to that depicted in FIG. 2a, except for also illustrating optional support for using a pair of bank address signals to transmit a binary-encoded indication of which single one of up to four banks of memory are involved in another given precharge command, in addition to supporting the use of individual signal lines to individually select one or more of up to four banks. In other words, FIG. 2c illustrates having the option to use either way to select banks to be involved in a precharge command to support a mixture of memory devices that do and do not support the use of individual signal lines to individually select banks. Coincident with the transmission of a precharge command during time point 286, address signal line A10 is either driven to a high state to indicate that all banks are affected by this precharge command or driven to a low state to indicate that only the single bank identified by the binary code provided on signal lines BA0 and BA1 is affected. One or more further clock transitions of the CK and –CK signal lines may occur between time points 286 and 288, during which any of a number of possible transfers of address, commands and/or data may occur. Another precharge command is transmitted during time point 288, and coincident with the transmission of this other precharge command is the setting of signal line A11 to a low state to indicate that an alternate way of selecting banks from what occurred at time point 286 will be used. This alternate way of selecting banks entails the individual use of address signal lines, such as A0-A3, as depicted, to separately select which one(s) of up to four banks are be involved in this other precharge command. This use of A11 permits toggling between these two ways of selecting banks from one occurrence of a precharge command to another, and could obviate the need to program one or more registers within memory devices as a way of prearranging which one of these ways of selecting banks will be used.

In various ones of the embodiments depicted in FIGS. 2a-c, the choice of which address signal lines may be used to specify the banks affected by a precharge command were made to promote interoperability with known synchronous DRAM interfaces, including, but not limited to, the currently widely used DDR variants of synchronous DRAM interfaces. With current DDR DRAM interfaces, the options for specifying which bank(s) are far more limited with the state of address signal line A10 during the actual transmission of the precharge command being used to specify only whether a single bank is affected or all banks are affected, and if only a single bank is affected, then the states of address signal lines BA0-BA1 provide a binary code specifying which of up to four banks is the one that is affected (other quantities of bank address signals and banks are possible). In contrast to such current DDR variants, the use of four address signal lines as described above in reference to FIGS. 2a and 2c (or the use of 16 address signal lines as described above in reference to FIG. 2b) allow any combination of up to four (or 16) banks to be selected as being affected by a given precharge. This capability to more precisely select banks could reduce time lost between accesses by avoiding the possible need to carryout the transmission of more than one precharge command of the type provided in current DDR variants to specify only one bank at a time in situations where multiple banks, but not all banks are to be precharged. To promote interoperability with the more limited current DDR variants, some embodiments may incorporate one or more bits in one or more control registers within memory device(s) to switch between the more limited current DDR variants of a precharge command and the use of an embodiment of the present invention. Indeed, a memory controller such as memory controller 170 of FIG. 1, may use accesses to registers within memory devices, such as memory device 190, to determine what capabilities are supported by a given memory device for specifying banks in a precharge command as part of making use of a capability to go beyond current DDR variants and individually specify banks where possible with some memory devices, while not attempting to make use of such a capability with other memory devices that do not support it.

Despite the specific mention of address lines A0-A3 in embodiments depicted in FIGS. 2a and 2c, or the specific mention of address lines A0-A11 and BA0-BA3 in embodiments depicted in FIG. 2b, those skilled in the art will readily recognize that any combination of address signal lines and/or other signal lines (perhaps control lines) may be employed for the purpose of specifying bank(s) affected by a given precharge command and/or providing interoperability with existing DDR variants without departing from the spirit and scope of the present invention as hereinafter claimed.

Figure 3B:
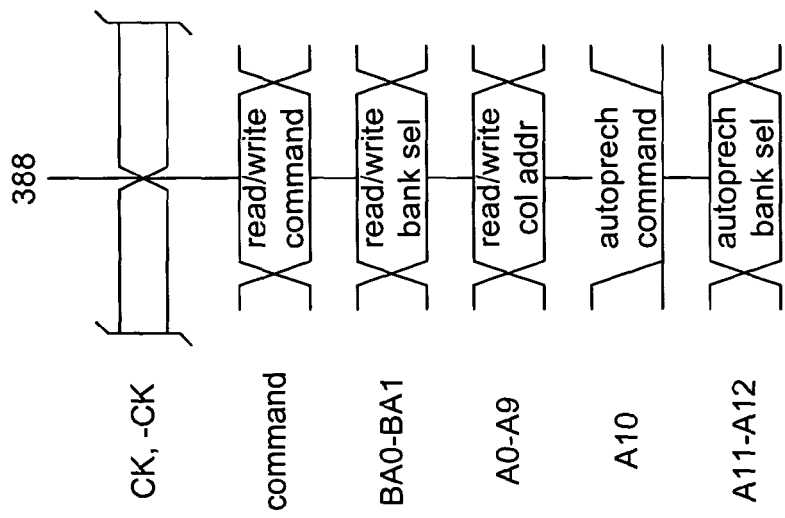
FIGS. 3a, 3b and 3c are timing diagrams of embodiments employing a memory bus.
Figure 3A:
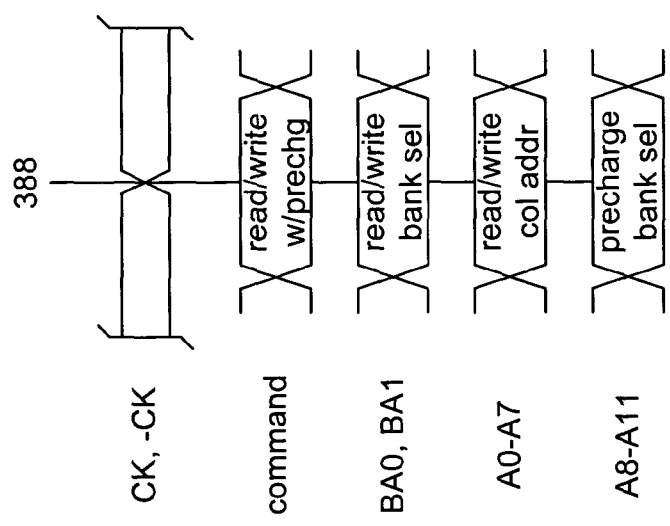
Figure 3C:
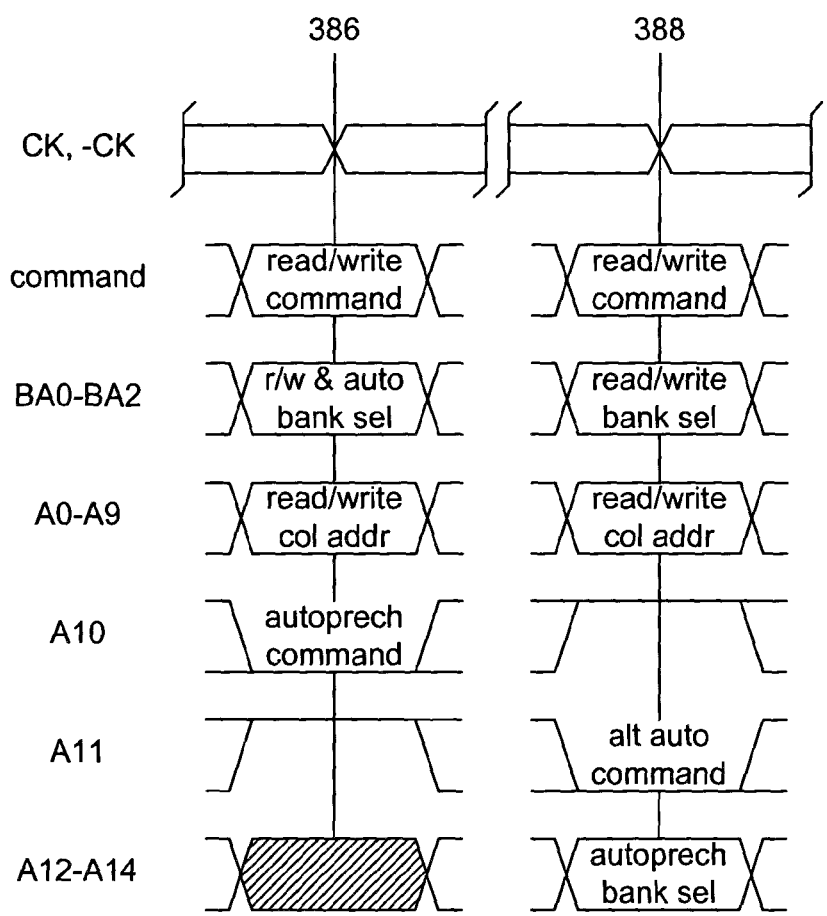

FIGS. 3a, 3b and 3c are timing diagrams of embodiments employing the transmission of signals across a memory bus. All of FIGS. 3a-c depict the transmission of a read or write command with autoprecharge to one or more memory devices. As will be familiar to those skilled in the art, a read or write command with autoprecharge (a precharge command embedded within the read or write command) causes a combination of a read or write operation immediately followed by a precharge operation to take place. Again, although these figures and the accompanying discussion center on embodiments of memory buses on which transactions take place that are synchronized to a clock signal, it will be readily understood by those skilled in the art that other embodiments may employ other forms of timing coordination or may be asynchronous. Also, although various embodiments are depicted with various specific quantities of banks, address signals and/ or bank address signals, those skilled in the art will readily understand that these embodiments are given these specific quantities as part of an effort to provide understandable examples for the sake of clarity of illustration, and should not be construed as limiting the spirit or scope of the present invention as hereinafter claimed. It is to be expected that differing quantities will likely be generated over time in implementations of the present invention that may someday arise.

FIG. 3a depicts an embodiment configured to have timings compatible with known synchronous DRAM interfaces. Coincident with the transmission of the actual read or write command during time point 388 is the transmission of the bank address of the bank involved in the read or write command via bank address signal lines BA0 and BA1, and the transmission of the column address of the column involved in the read or write command via address signal lines A0-A7. In one variation of such an embodiment, address signals A8 through A11 are used to separately select one or more of up to four banks to which the autoprecharge command embedded in the read or write command is to be applied. By way of example, this embodiment may be similar to that depicted in FIG. 1 such that a memory device receiving this command in this embodiment has four banks (banks 0 through 3), and the transmission of a high or low state via each of signals A8, A9, A10 and A11 coincident with the read or write command with autoprecharge may dictate whether or not each of banks 0, 1, 2 and 3, respectively, are affected by this transmission of the embedded autoprecharge command.

FIG. 3b depicts another embodiment configured to have timings compatible with known synchronous DRAM interfaces. Coincident with the actual transmission of a read or write command with autoprecharge during time point 388, is the transmission of the bank address of the bank involved in the read or write command via bank address signal lines BA0 and BA1, and in one variation of such an embodiment, the transmission of the column address of the column involved in the read or write command via address signal lines A0-A9. In such a variation, address signals A11-A12 are used to separately transmit a binary code permitting one other to be specified as being involved in the autoprecharge command embedded in the read or write command is to be applied. If it is not desired that the autoprecharge command be applied to any other bank than the bank involved in the read or write command, then the binary code transmitted via address signals A11-A12 may select the same bank as the one involved in the read or write command. The use of a binary code may be deemed preferable over the use of individual signal lines to individually select corresponding banks as depicted in FIG. 3a where the quantity of available signal lines is limited at the time of the transmission of the read/write commands with autoprecharge along with a column address.

FIG. 3c depicts another embodiment able to support up to 8 banks of memory and configured to have timings compatible with known synchronous DRAM interfaces. In a manner intended to be compatible with the protocols and timings of current DDR implementations, the transmission of a read or write command with autoprecharge during time point 386 is accompanied by the coincident transmission of the bank address of the bank involved in both the read/write and autoprecharge commands via bank address signal lines BA0 and BA2, and coincident transmission of the column address of the column involved in the read or write command via address signal lines A0-A9. In such a variation of embodiment, address signal A11 may be driven to a state (perhaps a high state, as depicted in FIG. 3c) intended to indicate that current DDR protocols are being adhered to. One or more clock transmissions may occur between time points 386 and 388, during which the transmission of one or more addresses, commands and/or data may occur as might be expected from normal operation of a memory bus. A transmission of a different read or write command with autoprecharge occurs during time point 388, and is accompanied by the coincident transmission of the bank address of the bank involved in the read or write command via bank address signals BA0-BA2, and the coincident transmission of the column address of the bank involved in the read or write command via address signals A0-A9. In such a variation of embodiment, address signal A11 may be driven to a state (perhaps a low state, as depicted in FIG. 3c) intended to indicate that an alternate or additional bank to which the autoprecharge command is to be applied is being selected, and address signals A12-A14 transmit a binary code selecting that alternate or additional bank. The driving of address signal A10 to a high state as shown in FIG. 3c could be interpreted in one variation as meaning that the bank involved in the read or write command is not also involved in the precharge command, and that the bank to be involved in the autoprecharge command is selected solely by address signals A12-A14. In such a variation, a low state on address signal A10 could be interpreted as meaning that the bank selected via BA0-BA2 is also involved in the autoprecharge command, in which case it is possible to select up to two banks be involved in the precharge command. Alternatively, the depicted driving of address signal A11 to a low state could be interpreted as meaning that the state of address signal A10 is to be ignored and that the sole bank to be involved in the precharge command is selected via a binary code on address signals A12-A14. In still another alternative, address signal A11 may not be used, at all (or A11 may be used along with A0-A9 to transmit a column address), and address signals A12-A14 may simply transmit a binary code of a second bank to be involved in the autoprecharge command, in which case, the binary code transmitted via A12-A14 may specify the same bank as selected via BA0-BA2 where instances occur that it is desired to have only one bank involved in the autoprecharge command.

Not unlike the embodiments discussed with reference to FIGS. 2a-c, the choice of which address signal lines may be used to specify the banks affected by an embedded autoprecharge command may, as was the case in FIGS. 3a-c, be made to promote interoperability with known synchronous DRAM interfaces, including, but not limited to, the currently widely used DDR variants of synchronous DRAM interfaces. In current DDR variants, the options for specifying which bank (s) are far more limited with the state of address signal line A10 being used to specify whether a precharge of only the bank being read from or written to should take place once the read or write command has been completed, or whether all of the banks are affected by the precharge called for in the embedded autoprecharge command. Use of four address signal lines as described above in reference to FIG. 3a to allow any combination of up to four banks to be selected as being affected by a given autoprecharge embedded within a read or write command, and the use of A11-A12 or A12-A14 in reference to FIGS. 3b-c to transmit a binary code selecting an alternate/additional bank, could be used as an alternative to what is known in current DDR variants to reduce time lost between accesses by reducing the possible need to carry out the transmission of one or more precharge commands.

Furthermore, despite the specific mention of address lines A8-A11, A11-A12 and A12-A14 in embodiments depicted in FIGS. 3a, 3b and 3c, respectively, those skilled in the art will readily recognize that any combination of address signal lines and/or other signal lines (perhaps control lines) may be employed for the purpose of specifying bank(s) affected by a given autoprecharge command without departing from the spirit and scope of the present invention as hereinafter claimed. Differing ones of various signal lines may be used for specifying banks with either individual correspondence between signal lines and banks, or a binary code, as permitted by various factors including the number of available signal lines, the number of banks, and the number of bits required to specify both row and column address in any given memory device. Specifically, although FIG. 3a depicts the use of only 8 signal lines (A0-A7) to specify a column address, more signal lines may be needed to specify a column address resulting in fewer signal lines being available to specify bank(s) affected by an autoprecharge command, perhaps resulting in the need to use a binary code, as was depicted in FIGS. 3b and 3c. In embodiments of memory systems in which memory devices of differing configurations are used, the configuration of some of the memory devices may altogether preclude separately specifying banks affected by an autoprecharge command, while other memory devices may have less restrictive configurations.

To promote interoperability with the more limited current DDR variants, some embodiments may incorporate one or more bits in one or more control registers with memory device(s) to switch between the more limited current DDR variants and the use of an embodiment of the present invention. The use of address signal lines in at least some embodiments may be implemented to promote interoperability by using the "extra" address lines that are often available when a column address is being transmitted, and thereby avoid interfering with current uses of other signal lines not related to the transmission of information for an embedded autoprecharge command. As those familiar with developments in DRAM technology will recognize, it has become commonplace for DRAM devices to use "asymmetric" addressing in which row addresses employ a larger number of address bits than do column addresses as a result of the preference of developers of DRAM devices to increase the number of rows without a corresponding increase in the number of columns in the two dimensional arrays of memory cells on which DRAM devices are based. As a result, the multiplexing of column addresses onto the same address signal lines as row addresses results in the need to have a large enough quantity of address signal lines for the transmission of the larger row addresses, and accepting the tradeoff that there will be "extra" address signal lines serving no function during the transmission of the smaller column addresses.

Figure 4:
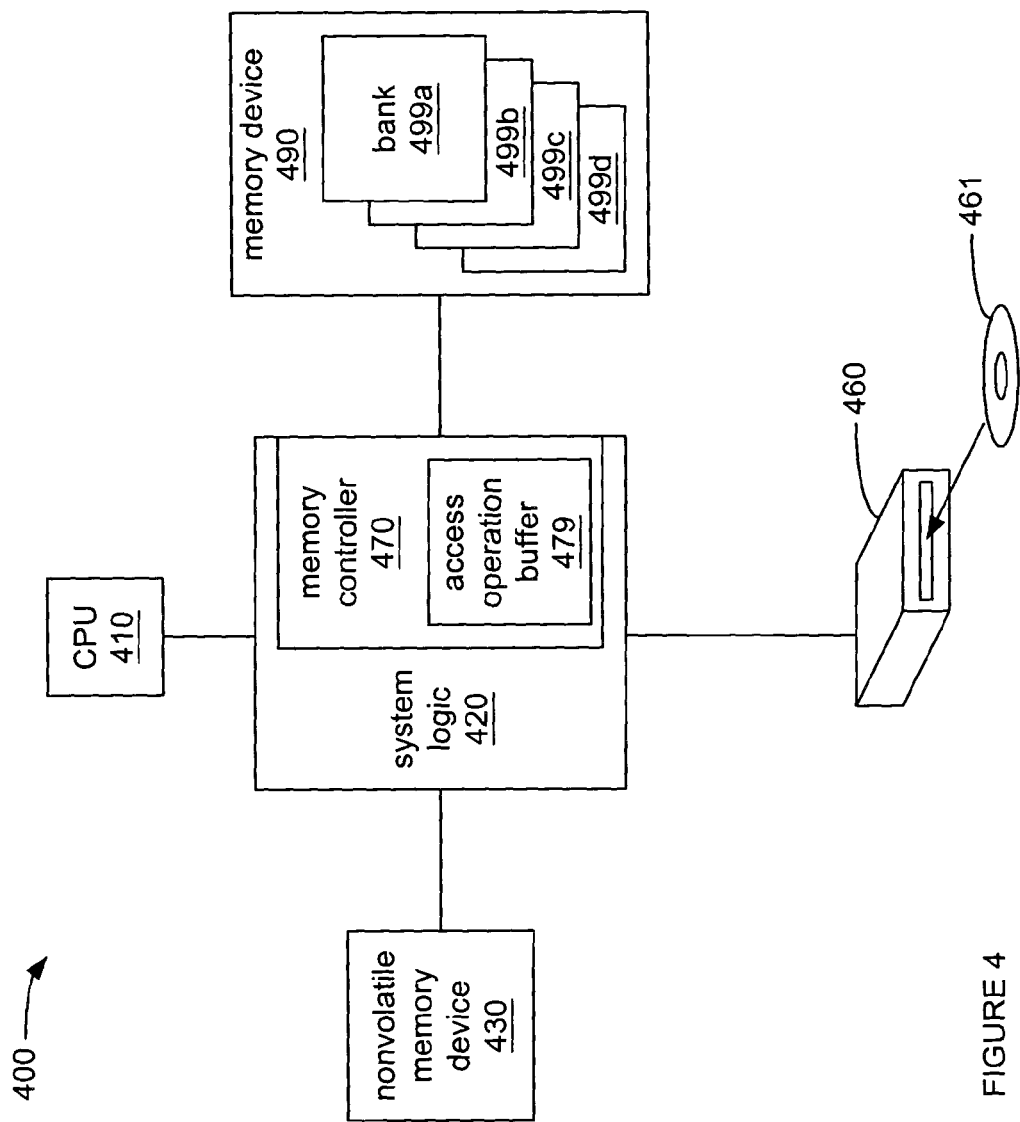
FIG. 4 is a block diagram of an embodiment employing a computer system.

FIG. 4 is a simplified block diagram of an embodiment employing a computer system. Computer system 400 is, at least in part, made up of CPU (central processing unit) 410, system logic 420, and memory device 490. System logic 420 is coupled to CPU 410 and performs various functions in support of CPU 410 including providing CPU 410 with access to memory device 490 to which system logic 420 is also coupled, using memory controller 470 within system logic 420. CPU 410, system logic 420 and memory device 490 make up a form of core for computer system 400 that is capable of supporting the execution of machine readable instructions by CPU 410 and the storage of data and instructions within memory device 490.

In various embodiments, CPU 410 could be any of a variety of types of CPU including a CPU capable of executing at least a portion of the widely known and used "x86" instruction set, and in other various embodiments, there could be more than one CPU. In various embodiments, memory device 490 could be any of a variety of types of dynamic random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc., and memory controller 470 provides logic 420 with an appropriate interface for the type of memory. At least a portion of the memory cells of memory device 490 are divided into banks 499a-d, each of which are made up of memory cells organized into rows and columns in a two dimensional memory array. To access a portion of the memory cells within memory device 490, that portion must be addressed by memory controller 470 with a combination of bank, row and column addresses. As those skilled in the art will recognize, the depiction of a single memory device 490 with four banks of memory cells, namely banks 499a-499d, is but an example of a memory system that could be a part of a computer system, and that a larger number of memory devices and/or a differing number of banks within memory devices could be used without departing from the spirit and scope of the present invention as hereinafter claimed.

In some embodiments, system logic 420 is coupled to and provides CPU 410 with access to storage device 460 by which data and/or instructions carried by storage media 461 may be accessed. Storage media 461 may of any of a wide variety of types and technologies as those skilled in the art will understand, including CD or DVD ROM, magnetic or optical diskette, magneto-optical disk, tape, semiconductor memory, characters or perforations on paper or other material, etc. In some embodiments, nonvolatile memory device 430 is coupled to system logic 420 (or other part of computer system 400) and provides storage for an initial series of instructions executed at a time when computer system 400 is either "reset" or initialized (for example, when computer system 400 is "turned on" or "powered up") to perform tasks needed to prepare computer system 400 for normal use. In some variations of such embodiments, upon initialization or resetting of computer system 400, CPU 410 accesses nonvolatile memory device 430 to retrieve instructions to be executed to prepare memory controller 470 for normal use in providing access for CPU 410 to memory device 490. It may be that these same retrieved instructions are executed to prepare system logic 420 for normal use in providing access to storage device 460 and whatever form of storage media 461 that may be used by storage device 460.

In some embodiments, storage media 461 and/or nonvolatile memory device 430 carries machine-accessible instructions to be executed by CPU 410 to cause CPU 410 to carry out one or more tests of memory device 490 to determine what type of DRAM device memory device 490 may be, and/or to determine what functions memory device 490 may support. If it is determined that memory device 490 is able to support the use of a precharge command in which the affected banks may be individually specified via individual bits transmitted with the precharge command, then CPU 410 may be caused to program or otherwise configure memory controller 470 to make use of such a precharge command.

Figure 5:
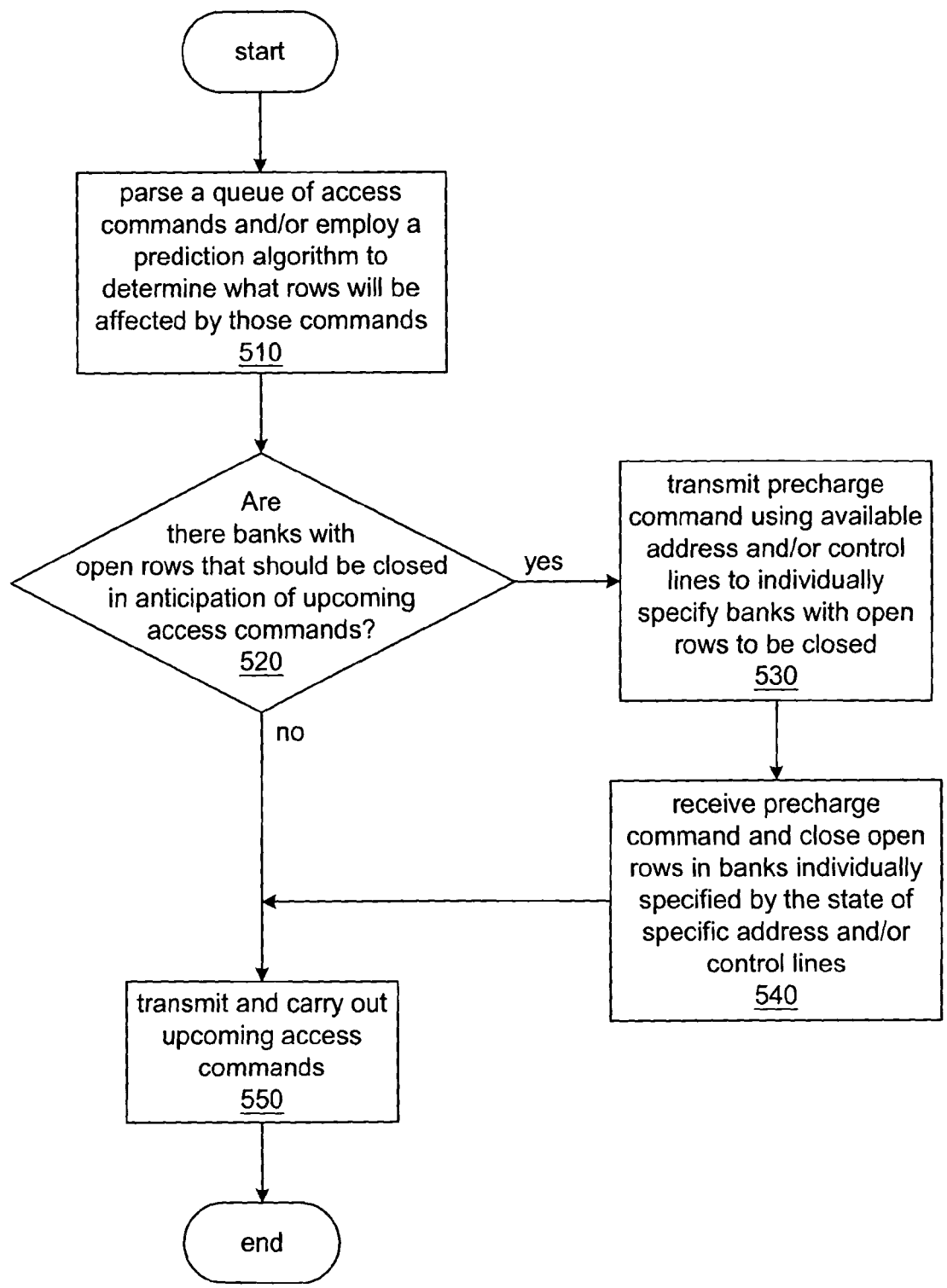
FIG. 5 is a flow chart of an embodiment.

FIG. 5 is a flow chart of embodiments. At 510, which rows in the banks of a memory device will be involved in upcoming access commands, including read and write commands, are determined by parsing a queue of access commands and/or employing one or more prediction algorithms. A determination is made at 520 as to whether or not there are any banks of a memory device having a currently open row that should be closed in anticipation of needing to open other row within such banks to accommodate upcoming access commands. If it is found that there are one or more banks with a currently open row that should be closed, then at 530, a precharge command is transmitted across a memory bus in which some address and/or control lines are used to individually specify the banks having a currently open row that should be closed, and at 540, the transmitted precharge command is received and the currently open row in each bank specified by the state of those address and/or control lines are closed. At 550, the upcoming access commands are transmitted and carried out.

Figure 6:
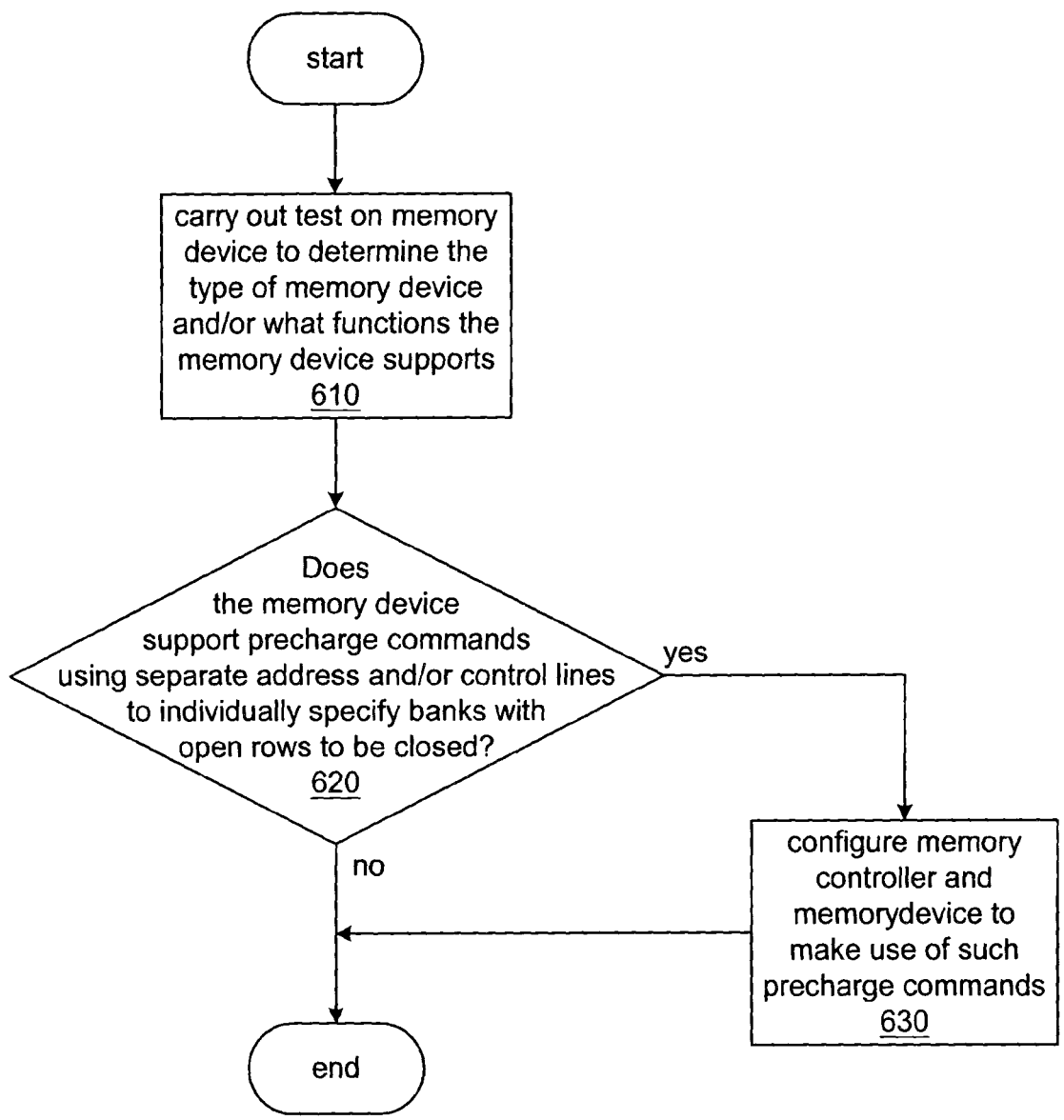
FIG. 6 is a flow chart of another embodiment.

FIG. 6 is a flow chart of another embodiment. At 610, tests are carried out to determine the type and characteristics of a memory device and/or what functions the memory device supports. At 620, a determination is made as to whether or not the memory device supports a precharge command in which separate address and/or control lines are individually used in a manner in which each one of those address and/or control lines corresponds to a bank within the memory device, and that the state of each of these address and/or control lines at a given time determines which bank(s) within the memory device are affected by a given precharge command. If the memory device does support such a form of precharge command, then the memory device and the memory controller to which the memory device is coupled are configured to make use of such a precharge command at 630.

The invention has been described in conjunction with various possible embodiments. It is evident that numerous alternatives, modifications, variations and uses will be apparent to those skilled in the art in light of the foregoing description. It will be understood by those skilled in the art that the present invention may be practiced in support of many possible types of memory devices employing any of a number of possible memory technologies. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. An apparatus comprising:
   a memory device having a plurality of banks, each bank comprised of:
      a plurality of memory cells organized into an array of rows and columns, wherein the memory device is capable of closing one or more open rows in one or more of the plurality of banks as individually specified in a precharge command, wherein the one or more open rows are closed to accommodate upcoming access commands; and
   control logic coupled to the plurality of banks to control accesses made to each bank in response to commands received from an external device, wherein the commands include the precharge command in which address lines are individually used to specify the one or more of the plurality of banks having the one or more open rows that are to be closed.

2. The apparatus of claim 1, wherein the memory bus comprises a subset of a plurality of signal lines used to individually specify the one or more of the plurality of banks that are affected by the precharge command, wherein the subset includes the address lines having row address lines to transmit a portion of a row address and not to transmit a portion of a column address as a result of a use of asymmetric addressing.

3. The apparatus of claim 2, wherein the row address lines are enabled via programming a register within the control logic.

4. The apparatus of claim 2, wherein the address lines further having bank address lines otherwise used to transmit a portion of a bank address in support of an alternate precharge command, and wherein the register programming is further to enable the row address lines to individually specify the one or more of the plurality of banks that are affected by the precharge command also results in disabling the bank address lines to support the alternate precharge command and in enabling the bank address lines to individually specify the one or more of the plurality of banks that are affected by the precharge command.

5. The apparatus of claim 2, wherein the precharge command is received by the control logic as part of an autoprecharge command embedded within an access command received by the control logic.

* * * * *